United States Patent
Kim et al.

(10) Patent No.: US 10,141,383 B2
(45) Date of Patent: Nov. 27, 2018

(54) ORGANIC LIGHT EMITTING DISPLAY DEVICE AND METHOD FOR MANUFACTURING THE SAME

(71) Applicant: LG Display Co., Ltd., Seoul (KR)

(72) Inventors: Youngmi Kim, Incheon (KR); Joonyoung Heo, Seoul (KR); Howon Choi, Paju-si (KR); Sungbin Shim, Yangsan-si (KR); Dongwoo Song, Seoul (KR); Hyesook Kim, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 389 days.

(21) Appl. No.: 14/802,358

(22) Filed: Jul. 17, 2015

(65) Prior Publication Data

US 2016/0035803 A1    Feb. 4, 2016

(30) Foreign Application Priority Data

Jul. 29, 2014    (KR) .................. 10-2014-0096377
Sep. 11, 2014    (KR) .................. 10-2014-0120202

(51) Int. Cl.
     *H01L 27/32*    (2006.01)
     *H01L 51/52*    (2006.01)

(52) U.S. Cl.
     CPC ........ *H01L 27/3246* (2013.01); *H01L 27/326* (2013.01); *H01L 27/3253* (2013.01); *H01L 27/3279* (2013.01); *H01L 27/322* (2013.01); *H01L 51/5221* (2013.01); *H01L 2227/323* (2013.01)

(58) Field of Classification Search
     CPC ............ H01L 51/5228; H01L 51/5212; H01L 27/3246; H01L 27/3244; H01L 27/3276; H01L 27/3248; H01L 27/3279; H01L 51/5203; H01L 51/5262; H01L 27/3206; H01L 27/3258; H01L 27/3281; H01L 27/3295; H01L 27/3253; H01L 27/326
     See application file for complete search history.

(56) References Cited

U.S. PATENT DOCUMENTS

| | | | |
|---|---|---|---|
| 2009/0315458 A1* | 12/2009 | Choi | H01L 27/3276 313/505 |
| 2010/0207107 A1* | 8/2010 | Kim | H01L 51/525 257/40 |
| 2012/0049207 A1* | 3/2012 | Kim | H01L 27/3246 257/88 |
| 2015/0243676 A1* | 8/2015 | Jung | H01L 51/5243 257/72 |
| 2016/0181566 A1* | 6/2016 | Wang | H01L 51/525 257/40 |

\* cited by examiner

*Primary Examiner* — Michael Jung
(74) *Attorney, Agent, or Firm* — Birch, Stewart, Kolasch & Birch, LLP (57) ABSTRACT

An organic light emitting display device according to an embodiment includes a lower substrate; a bank layer disposed on the lower substrate; a connection assistance unit disposed on the bank layer; a cathode disposed on the lower substrate so as to cover the bank layer; an auxiliary electrode disposed on the bank layer and electrically connected with the cathode; and an upper substrate provided to face the lower substrate.

20 Claims, 9 Drawing Sheets

ORGANIC LIGHT EMITTING DISPLAY DEVICE AND METHOD FOR MANUFACTURING THE SAME

CROSS-REFERENCE TO RELATED APPLICATIONS

This application claims the priority of Patent Application No. 10-2014-0096377 filed on Jul. 29, 2014, and Patent Application No. 10-2014-0120202 filed on Sep. 11, 2014, in the Republic of Korea, the disclosures of which are incorporated herein by reference.

BACKGROUND OF THE INVENTION

Field of the Invention

The present invention relates to an organic light emitting display device and a method for manufacturing the same, and more particularly, to an organic light emitting display device which has a sufficient aperture ratio and is minimized in a voltage drop at a cathode and a method for manufacturing the same.

Description of the Related Art

An organic light emitting display device (OLED) is a self-light emitting display device that does not need a separate light source unlike a liquid crystal display (LCD). Thus, the OLED can be manufactured in a lightweight and thin form. Further, the OLED is advantageous in terms of power consumption since it is driven with a low voltage. Also, the OLED has an excellent color expression ability, a high response speed, a wide viewing angle, and a high contrast ratio (CR). Therefore, the OLED has received attention as a next-generation display device.

Among organic light emitting display devices, a top-emission organic light emitting display device uses a transparent electrode or a semi-transmission electrode as a cathode in order to emit light emitted from an organic light emitting layer to an upper side. In both instances, where a transparent electrode is used as a cathode and where a semi-transmission electrode is used as a cathode, the cathode is formed to have small thickness in order to improve transmissivity. A decrease in thickness of the cathode causes an increase in electrical resistance of the cathode. Thus, with a large-sized organic light emitting display device, voltage drop may occur in the pixels that are located farther away from a voltage supply pad unit, which may cause non-uniformity in luminance of the organic light emitting display device.

In the conventional OLED devices, auxiliary electrodes and partition walls provided on the same substrate as the cathode have been used to minimize the voltage drop. More specifically, a partition wall having a reverse tapered shape is provided between two adjacent sub-pixels and an auxiliary electrode is placed under the partition wall (i.e., toward the smaller surface of the auxiliary electrode). The partition wall functions similar to an umbrella, and hinders the organic light emitting layer to be disposed thereunder. As such, the partition wall disconnects the organic light emitting layer between the sub-pixel areas and exposes a portion of the auxiliary electrode without being covered by the organic light emitting layer. As such, the cathode over the organic light emitting layer, which has better step coverage than the organic light emitting layer, can be in contact with the exposed portion of the auxiliary electrode under the partition wall.

In such a configuration, the size of the contact area between the auxiliary electrode and the cathode depends on the size of the exposed portion of the auxiliary electrode. Not much benefit is gained from the auxiliary electrode if the contact area between the auxiliary electrode and the cathode is too small. Accordingly, the partition walls need to be sufficiently large in order to expose the auxiliary electrode. In a given size of the organic light emitting display device, however, increasing the size of the partition walls translates to a decrease in the aperture ratio of the sub-pixels of the organic light emitting display device.

SUMMARY OF THE INVENTION

The inventors of the present invention recognized the problems of the conventional organic light emitting display device with the auxiliary electrodes configured under the partition walls as described above. Thus, the inventors invented an organic light emitting display device with a novel structure in which the cathode and the auxiliary electrodes are connected without using the partition wall, thereby providing sufficient contact area between a cathode and an auxiliary electrode without the undesired decrease in the aperture ratio of the sub-pixels.

An object of the present invention is to provide an organic light emitting display device configured to minimize the voltage drop caused by a resistance of a cathode in order to maintain uniformity in luminance of the entire display, and a method for manufacturing the same.

Another object of the present invention is to provide an organic light emitting display device in which a contact resistance is greatly decreased due to a large contact area between an auxiliary electrode and a cathode, and a method for manufacturing the same.

Yet another object of the present invention is to provide an organic light emitting display device which can solve a problem of a decrease in an aperture ratio caused by disposing an auxiliary electrode between sub-pixel areas, and a method for manufacturing the same.

According to an aspect of the present invention, in order to achieve the above-described objects, there is provided an organic light emitting display device comprising a lower substrate and an upper substrate; a bank layer on the lower substrate to define a plurality of sub-pixel areas; a cathode provided on the lower substrate, the cathode covering the plurality of sub-pixel areas and the bank layer; an auxiliary electrode provided on the upper substrate, the auxiliary electrode being positioned between two immediately adjacent sub-pixel areas among the plurality of pixel areas defined by the bank layer; and a connection assistance unit provided on at least one of the lower substrate and the upper substrate, wherein the connection assistance unit is positioned to allow the auxiliary electrode on the upper substrate to be in contact with the cathode on the lower substrate.

According to another feature of the present invention, the connection assistance unit may be formed of a material that expands upon laser irradiation.

According to yet another feature of the present invention, the connection assistance unit may be interposed between the bank layer and the cathode such that a portion of the cathode on the bank layer is protruded toward the auxiliary electrode on the upper substrate.

According to still another feature of the present invention, the organic light emitting display device may further comprise an additional connection assistance unit interposed between the auxiliary electrode and the upper substrate such that the auxiliary electrode over the connection assistance unit is protruded toward a portion of the cathode on the bank layer.

According to still another feature of the present invention, the additional connection assistance may be formed of a material that expands upon laser irradiation.

According to still another feature of the present invention, the organic light emitting display device may further comprise a first color filter and a second color filter on the upper substrate, each of the first color filter and the second color filter may correspond to a different sub-pixel area of the two immediately adjacent sub-pixel areas separated by the auxiliary electrode, wherein at least one of the first color filter and the second color filter may be arranged to overlap with the auxiliary electrode.

According to still another feature of the present invention, the organic light emitting display device may further comprise an alignment key disposed in a non-display area of the upper substrate for alignment between the upper and lower substrates; and a spacer on the upper substrate provided under the auxiliary electrode, the spacer and the alignment key may be formed of a same material.

According to still another feature of the present invention, the connection assistance unit may be interposed between the auxiliary electrode and the upper substrate such that the auxiliary electrode over the connection assistance unit is protruded toward a portion of the cathode on the bank layer.

According to still another feature of the present invention, the auxiliary electrode may be configured to prevent the mixing of colors between a first sub-pixel area and a second sub-pixel area.

According to still another feature of the present invention, the auxiliary electrode may have a hydrophobic property.

According to another aspect of the present invention to achieve the above-described objects, there is provided a method for manufacturing an organic light emitting display device, comprising: a step of forming a bank layer on a lower substrate to define a plurality of sub-pixel areas; a step of providing a laser expandable material on at least one of the lower substrate and an upper substrate, wherein the laser expandable material is formed in a region between two immediately adjacent sub-pixel areas among the plurality of sub-pixel areas; a step of forming a cathode on the lower substrate so as to cover the plurality of sub-pixel areas and the bank layer; a step of forming an auxiliary electrode on an upper substrate, wherein the auxiliary electrode is formed in the region between the two immediately adjacent sub-pixel areas among the plurality of sub-pixel areas; a step of bonding the lower and upper substrates with an adhesive resin; and a step of irradiating the laser expandable material with a laser to expand the laser expandable material so that the cathode and the auxiliary electrode come in contact with each other.

According to another feature of the present invention, the laser expandable material may be provided on the upper substrate such that the laser expandable material is interposed between the auxiliary electrode and the upper substrate.

According to yet another feature of the present invention, the laser expandable material may be provided on the lower substrate such that the laser expandable material is interposed between the cathode and the bank layer.

As such, the present invention can minimize the occurrences of voltage drop in the cathode by electrically connecting the cathode on the lower substrate to the auxiliary electrode provided on the upper substrate to increase the contact area between the auxiliary electrode and the cathode. Accordingly, uniformity in luminance of the organic light emitting display device can be obtained without having to sacrifice the aperture ratio of the sub-pixels by the use of the partition walls.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENTS

Advantages and features of the present invention, and methods for accomplishing the same will be more clearly understood from exemplary embodiments described below with reference to the accompanying drawings. However, the present invention is not limited to the following exemplary embodiments and may be implemented in various different forms. The exemplary embodiments are provided only to complete disclosure of the present invention and to fully provide a person having ordinary skill in the art to which the present invention pertains with the category of the invention, and the present invention will be defined by the appended claims.

The shapes, sizes, ratios, angles, numbers, and the like shown in the accompanying drawings for describing the exemplary embodiments of the present invention are merely examples, and the present invention is not limited thereto. Like reference numerals generally denote like elements throughout the present specification.

In the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Ranges relating to some of the components mentioned in the disclosure may be adjusted by the ordinary fabrication error margins even though the increase or decrease of the range by the fabrication error margins is not expressly stated.

When the position relation between two parts is described using the terms such as "on", "above", "below", "next" and the like, one or more parts may be positioned between the two parts unless the terms are used with the term "immediately" or "directly" is not used.

Unless expressly stated otherwise, an element or a layer described as being "on" another element or "adjacent" to another element is not necessarily placed directly on the other element or immediately adjacent to another element. Other layers or elements may be present therebetween, unless one is directly on another element/layer or immediately adjacent to another element/layer.

Although the terms "first", "second", and the like are used for describing various components, these components are not confined by these terms. These terms are merely used for distinguishing one component from the other components. Therefore, a first component to be mentioned below may be a second component in a technical concept of the present invention.

Various exemplary embodiments of the present invention will be described in detail with reference to the accompanying drawings.

Figure 1:
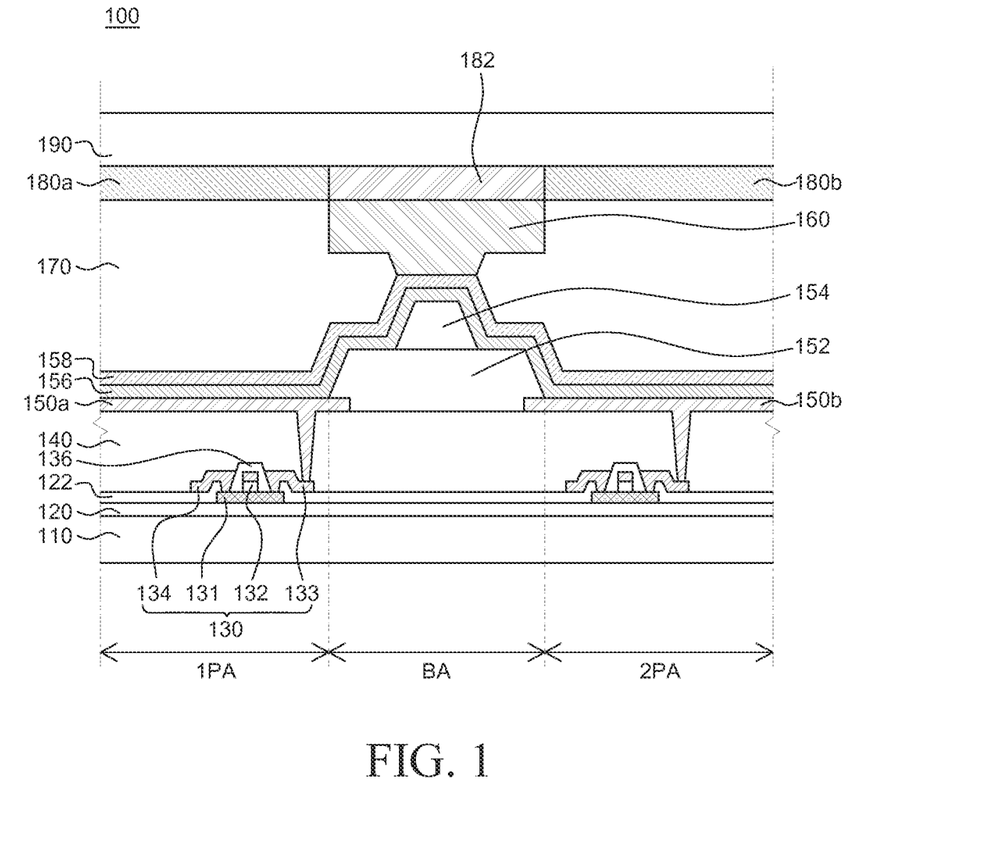
FIG. 1 is a schematic cross-sectional view of a top-emission organic light emitting display device according to an exemplary embodiment of the present invention.

FIG. 1 is a schematic cross-sectional view of a top-emission organic light emitting display device according to an exemplary embodiment of the present invention.

Referring to FIG. 1, an organic light emitting display device 100 according to an exemplary embodiment of the present invention includes a lower substrate 110, a buffer layer 120, a gate insulating layer 122, a thin film transistor 130 an interlayer dielectric layer 136, an overcoating layer 140, a first anode 150a, a second anode 150b, a bank layer 152, a connection assistance unit 154, an organic light emitting layer 156, a cathode 158, an auxiliary electrode 160, an adhesive resin layer 170, a first color filter layer 180a, a second color filter layer 180b, a black matrix 182, and an upper substrate 190.

The lower substrate 110 and the upper substrate 190 support various components of the organic light emitting display device 100. The lower substrate 110 and the upper substrate 190 may be formed of a material provided with some degree of transparency and flexibility, for example polyimide (PI), thin-glass and the like.

A bank layer is provided on lower substrate 110 to define a plurality of sub-pixels between the lower substrate 110 and the upper substrate 190. That is, the bank area BA is configured to separate multiple sub-pixel areas, and does not emit light. For instance, a first sub-pixel area 1PA and a second sub-pixel area 2PA are separated by the bank area BA of the bank layer. The first sub-pixel area 1PA and the second sub-pixel area 2PA are configured to emit light of a different color from one another. The first sub-pixel area 1PA and the second sub-pixel area 2PA are configured to emit light any one of red, green, blue and white color.

The buffer layer 120 is formed on the lower substrate 110. The buffer layer 120 may be formed of a transparent material. The buffer layer 120 protects the components on the lower substrate 110 from undesired impurities or moisture. It should be noted that the buffer layer 120 may not be provided on the lower substrate 110 depending on the material of the lower substrate 110. Also, the structure, placement and the material of the buffer layer 120 can vary depending on the structure of the thin film transistor 130 as well as the type of the active layer 131 used in the thin-film transistor 130.

The thin film transistor 130 is disposed on the buffer layer 120. As illustrated in FIG. 1, the thin film transistor 130 includes an active layer 131, a gate electrode 132, a source electrode 133, and a drain electrode 134. In the example depicted in FIG. 1, the active layer 131 is formed on the buffer layer 120, the gate insulting layer 122 for insulating the active layer 131. The gate electrode 132 is formed on the active layer 131, and the gate electrode 132 is formed on the gate insulating layer 122 so as to be overlapped with the active layer 131. The interlayer dielectric layer 136 is formed on the gate electrode 132 and the gate insulating layer 122, and the source electrode 133 and the drain electrode 134 are formed on the interlayer dielectric layer 136. The source electrode 133 and the drain electrode 134 are electrically connected with the active layer 131. In the drawings of the present specification, only a driving thin film transistor among various thin film transistors in the organic light emitting display device 100 is illustrated for convenience of explanation. Further, in the present specification, the thin film transistor 130 having a coplanar structure is described, but a thin film transistor having an inverted staggered structure can also be used.

The overcoating layer 140 is disposed on the thin film transistor 130. The overcoating layer 140 is configured to planarize an upper portion of a substrate.

The first anode 150a and the second anode 150b are disposed on the overcoating layer 140. Contact holes are provided through the overcoating layer 140 to electrically connect the source electrode 133 of the thin film transistor 130 with the first anode 150a and the second anode 150b. Each of the first anode 150a and the second anode 150b applies a voltage to the organic light emitting layer 156. As illustrated in FIG. 1, the first anode 150a and the second anode 150b are separated from each other such that the first anode 150a is provided in the first sub-pixel area 1PA and the second anode 150b is provided in the second sub-pixel area 2PA.

Each of the first anode 150a and the second anode 150b may be formed of a transparent conductive material having a high work function value and a reflector. Herein, the transparent conductive material may include indium tin oxide (ITO), indium zinc oxide (IZO), and indium tin zinc oxide (ITZO).

The bank layer 152 is disposed to cover edges of the first anode 150a and the second anode 150b. The bank layer 152 is disposed in the bank area BA and separates the adjacent sub-pixel areas 1PA and 2PA. The bank layer 152 may be formed of any one of transparent organic insulating materials such as polyimide, photo acryl, and benzocyclobutene (BCB), or may be formed of a black material such as a black resin.

The connection assistance unit 154 is interposed between the lower substrate 110 and the upper substrate 190 such that the cathode 158 and the auxiliary electrode 160 can be easily brought into contact with each other. In FIG. 1, the connection assistance unit 154 is disposed on the bank layer 152 in the bank area BA so that its position corresponds to the auxiliary electrode 160. The connection assistance unit 154 provided on the upper surface of the bank layer 152 at the bank area BA may be tapered toward the auxiliary electrode 160 provided on the upper substrate.

The connection assistance unit 154 may be formed of the same material as that of the bank layer 152, or may be formed of the same material as that of a column spacer, which may be provided in the organic light emitting display device 100.

Further, the connection assistance unit 154 may be formed of a material that expands by laser irradiation. To be specific, the connection assistance unit 154 may comprise a binder, an IR dye, a crosslinker, a plasticizer, and the like. Since the connection assistance unit 154 is formed of a material that expands by laser irradiation, the connection assistance unit 154 disposed in the bank area BA expands upon laser irradiation and facilitates the cathode 158 and the auxiliary electrode 160 to be in contact with each other in the bank area BA.

As such, the bank layer 152 at the bank area BA does not need a height that makes the cathode 158 and the auxiliary electrode 160 to be in contact with each other. The height of the bank layer 152 at the bank area BA is sufficient so long as the contact between the cathode 158 and the auxiliary electrode 160 can be made by the expansion of the connection assistance unit 154. For example, the bank layer 152 may have a height equal to or higher than 1 μm.

Although the connection assistance unit 154 is provided between the bank layer 152 and the cathode 158 in the example depicted in FIG. 1, in some other embodiments, the connection assistance unit 154 may be provided between the auxiliary electrode 160 and the upper substrate 190. In some embodiments, the connection assistance unit 154 may be provided between the bank layer 152 and the cathode 158 as well as between the auxiliary electrode 160 and the upper substrate 190.

The organic light emitting layer 156 is disposed on the first anode 150a, the second anode 150b, the bank layer 152, and the connection assistance unit 154. The organic light emitting layer 156 is configured to receive a voltage from the first anode 150a, the second anode 150b, and the cathode 158 and emit light. In FIG. 1, the organic light emitting layer 156 is illustrated as being continuously disposed over the entire first sub-pixel area 1PA, the bank area BA and the second sub-pixel area 2PA. The organic light emitting layer 156 may be configured to emit white light. However, it should be noted that the organic light emitting layers 156 in the first sub-pixel area 1PA and the second sub-pixel area 2PA may be separated from each other and configured to emit different colors from one another.

The cathode 158 is disposed on the organic light emitting layer 156. As illustrated in FIG. 1, the cathode 158 is disposed continuously over the first sub-pixel area 1PA, the bank area BA and the second sub-pixel area 2PA. The cathode 158 is arranged such that the organic light emitting layer 156 is interposed between the cathode 158 and the anode (150a, 150b). The cathode 158 may be connected to a power line and configured to apply the same voltage to all of the sub-pixel areas. The cathode 158 may be formed of very thin layer of one or more of metallic materials with a low work function value, such as silver (Ag), titanium (Ti), aluminum (Al), molybdenum (Mo), or an alloy of silver (Ag) and magnesium (Mg). With sufficiently thin layer of such materials, the cathode 158 can be transparent enough to transmit light from the organic light emitting layer 156. In some embodiments, the cathode 158 is formed from transparent materials such as ITO or IZO.

The auxiliary electrode 160 is disposed on the upper substrate 190 (i.e., the substrate other than the one provided with the anode 150, the organic light emitting layer 156 and the cathode 158). The auxiliary electrode 160 is positioned on the upper substrate 190 such that it is aligned to the bank area BA when the upper substrate and the lower substrate are joined together. As illustrated in FIG. 1, the auxiliary electrode 160 may be protruded toward the cathode 158 in the bank area BA. The auxiliary electrode 160 may be formed of a material having a sheet resistance of about 50 Ω/sq or less, such as aluminum (Al), copper (Cu), molybdenum (Mo), and silver (Ag). The auxiliary electrodes may be formed in a line parallel to gate lines or data lines of the organic light emitting display device. Also, the auxiliary electrodes may be provided in a mesh pattern corresponding to the bank layer. The auxiliary electrode 160 is in contact with the cathode 158 in the bank area BA to help suppress occurrences of voltage drops in the cathode 158.

The cathode 158 and the auxiliary electrode 160 may be connected by welding. To be more specific, a part of the cathode 158 and/or a part of the auxiliary electrode 160 can be melted by a laser beam, and then gradually hardened as a temperature decreases. In this process, the cathode 158 and the auxiliary electrode 160 can be directly contact each other. Since the cathode 158 and the auxiliary electrode 160 are connected by welding, a sufficient contact area between the cathode 158 and the auxiliary electrode 160 can be obtained. It should be noted that the connection assistance unit 154 may be expanded by the laser beam that is used to melt the part of the cathode 158 and/or the part of the auxiliary electrode 160. That is, the expansion of the connection assistance unit 154 may occur as the melting of the cathode 158 and/or the auxiliary electrode 160 is carried out by the laser irradiation. In some cases, a separate laser irradiation processes can be used for the expansion of the connection assistance electrode 154 and for the melting of the cathode 158 and/or the auxiliary electrode 160. A laser beam may be irradiated from the outside of the upper substrate 190 toward the cathode 158 and the auxiliary electrode 160, but the direction in which the laser is irradiated from may not be limited as described above.

If a laser beam is irradiated to the sub-pixel areas 1PA and 2PA, the organic light emitting layer 156 disposed in the sub-pixel areas 1PA and 2PA may be damaged. Therefore, a laser beam cannot be irradiated to the entire surface of the upper substrate 190 to connect the cathode 158 and the auxiliary electrode 160. Accordingly, the laser should be irradiated on the targeted regions. Here, the time needed for connecting the cathode 158 and the auxiliary electrode 160 increases as a region in need of laser irradiation, i.e., the region where the cathode 158 and the auxiliary electrode 160 to be in contact, which slows down the production of the organic light emitting display devices.

Accordingly, the number of auxiliary electrodes 160 provided in the organic light emitting display device 100 is not particularly limited. Further, the size and the number of actual contact areas between the cathode 158 and the auxiliary electrode 160 can be changed considering the magnitude of the voltage drop as well as the manufacturing time of the organic light emitting display device 100. For example, in some embodiments, the entire portion of the auxiliary electrode 160 provided along the bank area BA may be in contact with the cathode 158. In some other embodiments, only limited portions of the auxiliary electrode 160 may be in contact with the cathode 158, even though the auxiliary electrode 160 extends along the bank area BA. For instance, the cathode 158 and the auxiliary electrode 160 may be in contact with each other only at certain limited areas within the bank areas BA around the sub-pixel areas.

The adhesive resin layer 170 is provided between the lower substrate 110 and the upper substrate 190. In a state where the adhesive resin is provided between the lower substrate 110 and the upper substrate 190, the adhesive resin can be hardened by heat or ultraviolet rays to bond the two substrates. However, the adhesive resin layer 170 may be formed of a thermosetting resin having a hydrophilic property and hardened by heat or ultraviolet rays.

In some embodiments, the adhesive resin may be coated on the upper substrate 190, then the lower substrate 110 and the upper substrate 190 are aligned over each other to be bonded together. In order for the auxiliary electrode 160 to be in contact the cathode 158, it is preferred that the surface of the auxiliary electrode 160 facing the cathode 158 is exposed through the adhesive resin coated on the upper substrate 190.

As mentioned, the adhesive resin may have a hydrophilic property. In such cases, the surface of the auxiliary electrode 160 facing the cathode 158 may be processed to have a hydrophobic property to minimize the surface of the auxiliary electrode 160 covered by the adhesive resin 170 coated over the upper substrate 190.

In this regard, the surface of the auxiliary electrode 160 may be treated with plasma to provide a hydrophobic property. For example, in order for the surface of the auxiliary electrode 160 to have a hydrophobic property, the auxiliary electrode 160 may be disposed within a plasma chamber and a tetrafluoromethane (CF4) gas may be introduced into the chamber, and a chamber pressure and an application voltage may be regulated. Further, in order for the surface of the auxiliary electrode 160 to have a hydrophobic property, the surface of the auxiliary electrode 160 may be doped with hydrophobic ions.

The upper substrate 190 may be provided with a plurality of color filters. In FIG. 1, the first color filter layer 180a and the second color filter layer 180b are provided in the first sub-pixel area 1PA and in the second sub-pixel area 2PA, respectively. Each of the first color filter layer 180a and the second color filter layer 180b is configured to transmit light of a specific color. Each of the first color filter layer 180a and the second color filter layer 180b may have a thickness from 1 μm to 3 μm, but may not be limited thereto.

The black matrix 182 is provided on the upper substrate 190, and is disposed between the first color filter layer 180a and the second color filter layer 180b. The black matrix 182 may be formed of a material that does not transmit light. The black matrix 182 prevents the mixing of colors between the first sub-pixel area 1PA and the second sub-pixel area 2PA.

As described above, conventional organic light emitting display devices use a partition wall having a reverse taper shape and is disposed on a bank layer to expose at least some portion of an auxiliary electrode placed thereunder. Thus, the size of non-light emitting region between the two sub-pixel areas can be increased by the partition wall, for example, to about 20 μm. Accordingly, the partition wall causes reduction in the aperture ratio of the sub-pixels of the organic light emitting display device. Further, only the exposed portion of the auxiliary electrode created by the partition wall is in contact with the cathode. In such a configuration, the width of the contact area of the cathode and the auxiliary electrode may be merely about 1 μm. Therefore, the size of the contact area between the cathode and the auxiliary electrode may not be enough to alleviate the voltage drop issue in the organic light emitting display device.

In the organic light en fitting display device 100 of an embodiment of the present invention, however, the cathode 158 and the auxiliary electrode 160 are placed on the opposite substrates of the organic light emitting display device 100. Also, the organic light emitting display device 100 employs the connection assistance unit 154, which expands upon irradiation of the laser, to ensure that the cathode 158 and the auxiliary electrode 160 are in a direct contact with each other. Therefore, a much greater contact area can be provided between the cathode 158 and the auxiliary electrode 160 in the organic light emitting display device 100 without having to use the partition wall. By way of an example, the width of the contact surface between the cathode 158 and the auxiliary electrode 160 at the bank area BA can be about 50 μm, which is much greater than the width of the contact area that would have been created by the partition wall in the organic light emitting display device of the same size. With a much greater contact area, the contact resistance between the cathode 158 and the auxiliary electrode 160 can be greatly reduced and occurrences of the voltage drop can be minimized. Further, more sub-pixels having a large aperture ratio can be provided in the organic light emitting display device 100 as a sufficient contact area between e cathode 158 and the auxiliary electrode 160 can be obtained without the partition wall.

Figure 2:
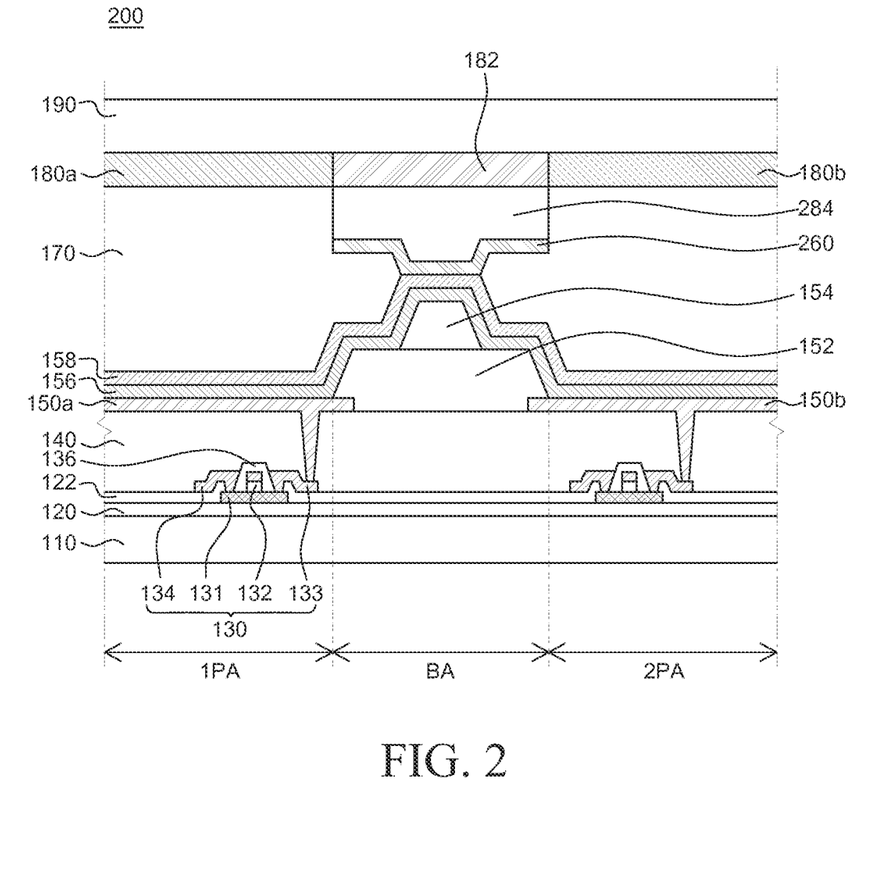
FIG. 2 is a schematic cross-sectional view of a top-emission organic light emitting display device according to another exemplary embodiment of the present invention.

FIG. 2 is a schematic cross-sectional view of a top-emission organic light emitting display device according to another exemplary embodiment of the present invention.

An organic light emitting display device 200 illustrated in FIG. 2 is substantially the same as the organic light display device 100 illustrated in FIG. 1 except an additional connection assistance unit 284 is further included. Therefore, redundant explanation thereof will be omitted.

Referring to FIG. 2, the organic light emitting display device 200 according to another exemplary embodiment of the present invention includes the additional connection assistance unit 284. The additional connection assistance unit 284 may be disposed between the auxiliary electrode 260 and the upper substrate 190 so that the cathode 158 and the auxiliary electrode 260 can be more readily welded and connected by laser irradiation.

To this end, the additional connection assistance unit 284 is disposed so as to correspond to the auxiliary electrode 260 in the bank area BA. The additional connection assistance unit 284 is disposed on the upper substrate 190 before the lower substrate 110 and the upper substrate 190 are bonded to each other. As illustrated in FIG. 2, the additional connection assistance unit 284 may have a shape protruding toward the bank layer 152. Similar to the connection assistance unit 154, the additional connection assistance unit 284 can also be formed of a material that expands when irradiated with a laser to ensure the cathode 158 and the auxiliary electrode 260 are in contact to each other.

Figure 3:
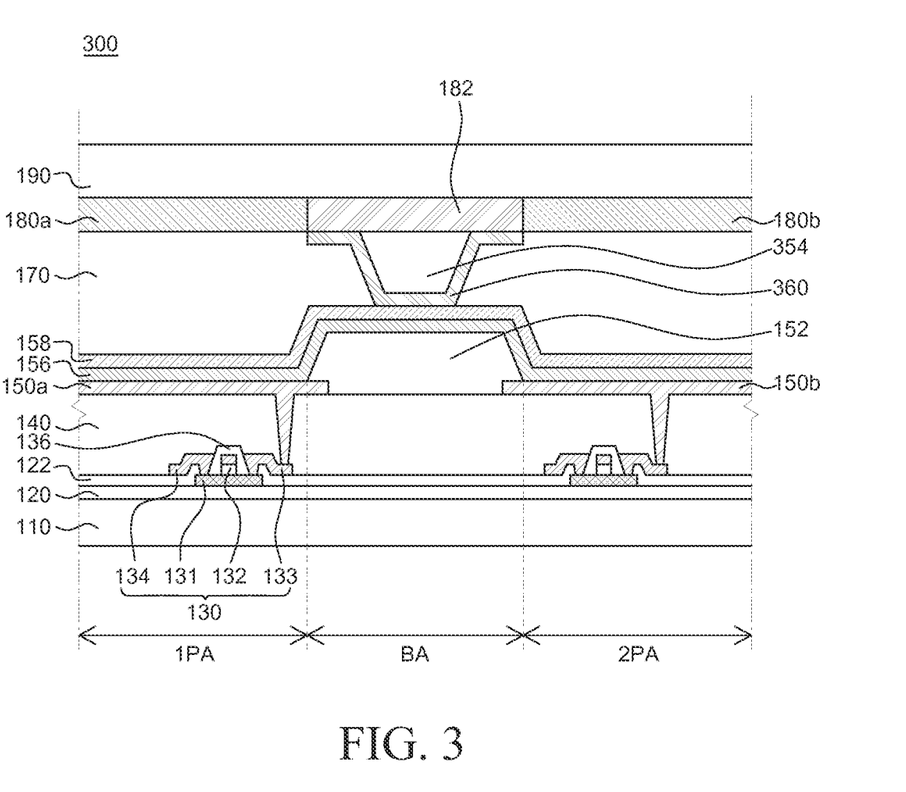
FIG. 3 is a schematic cross-sectional view of a top-emission organic light emitting display device according to yet another exemplary embodiment of the present invention.

FIG. 3 is a schematic cross-sectional view of yet another exemplary embodiment of the present invention provided with a connection assistance unit to increase the contact area between the auxiliary electrode and the cathode as well as the aperture ratio of the sub-pixels.

Referring to FIG. 3, the connection assistance unit 354 is disposed between the auxiliary electrode 360 and the upper substrate 190, rather than being provided between the bank layer 152 and the cathode 158 in the bank area BA. The connection assistance unit 354 tapers down toward the cathode 158. That is, the portion of the connection assistance unit 354 that is closer to the cathode 158 is narrower than the portion that is farther away from the cathode 158. The connection assistance unit 354 illustrated in FIG. 3 may be disposed on the upper substrate 190 before the lower substrate 110 and the upper substrate 190 are bonded to each other.

The organic light emitting display device 300 illustrated in FIG. 3 is substantially the same as the organic light emitting display device 100 illustrated in FIG. 1 except a connection assistance unit 354 is disposed between an auxiliary electrode 360 and the upper substrate 190 such that the auxiliary electrode 360 covers the connection assistance unit 354. Therefore, redundant explanation thereof will be omitted.

Figure 4:
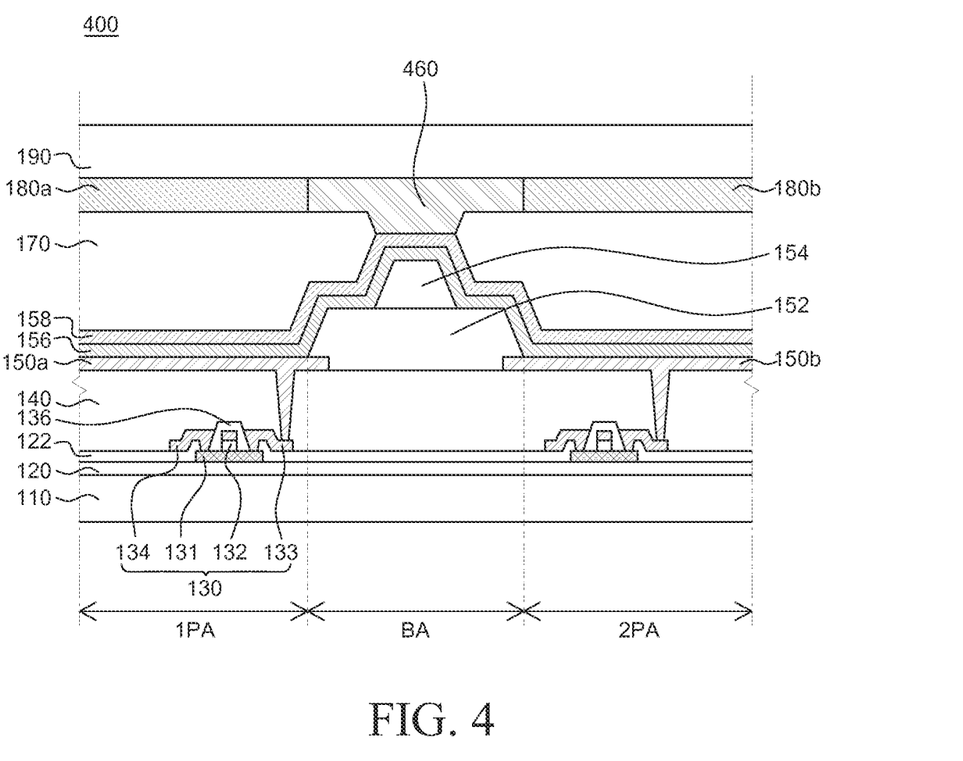
FIG. 4 is a schematic cross-sectional view of a top-emission organic light emitting display device according to still another exemplary embodiment of the present invention.

FIG. 4 is a schematic cross-sectional view of a top-emission organic light emitting display device according to still another exemplary embodiment of the present invention.

An organic light emitting display device 400 illustrated in FIG. 4 is substantially the same as the organic light emitting display device 100 illustrated in FIG. 1 except that instead of the black matrix 182, an auxiliary electrode 460 serves as a black matrix. Therefore, redundant explanation thereof will be omitted.

Referring to FIG. 4, the auxiliary electrode 460 is disposed between the first color filter layer 180a and the second color filter layer 180b. The auxiliary electrode 460 is configured to minimize a voltage drop at the cathode 158 and also prevent mixing of colors between the first sub-pixel area 1PA and the second sub-pixel area 2PA. For example, the auxiliary electrode 460 is formed of a metal having a reflection property so as to reflect light leaking from the first sub-pixel area 1PA to the second sub-pixel 2PA and reflect a light leaking from the second sub-pixel 2PA to the first sub-pixel area 1PA. Considering that the auxiliary electrode 460 prevents the mixing of colors between the sub-pixel areas 1PA and 2PA, the auxiliary electrode 460 can be said to serve as the black matrix 182 in the organic light emitting display device 100 illustrated in FIG. 1.

The auxiliary electrode 460 may be formed of a base metal having a reflection property, such as aluminum (Al), copper (Cu), and molybdenum (Mo). Further, in order to minimize outer light reflection, the auxiliary electrode 460 may be formed of a low-reflectivity metal having a light reflectivity of 20 to 40%.

In the organic light emitting display device 400 according to still another exemplary embodiment of the present invention, the auxiliary electrode 460 serves as a black matrix. Thus, manufacturing costs of the organic light emitting display device 400 can be reduced.

Figure 5:
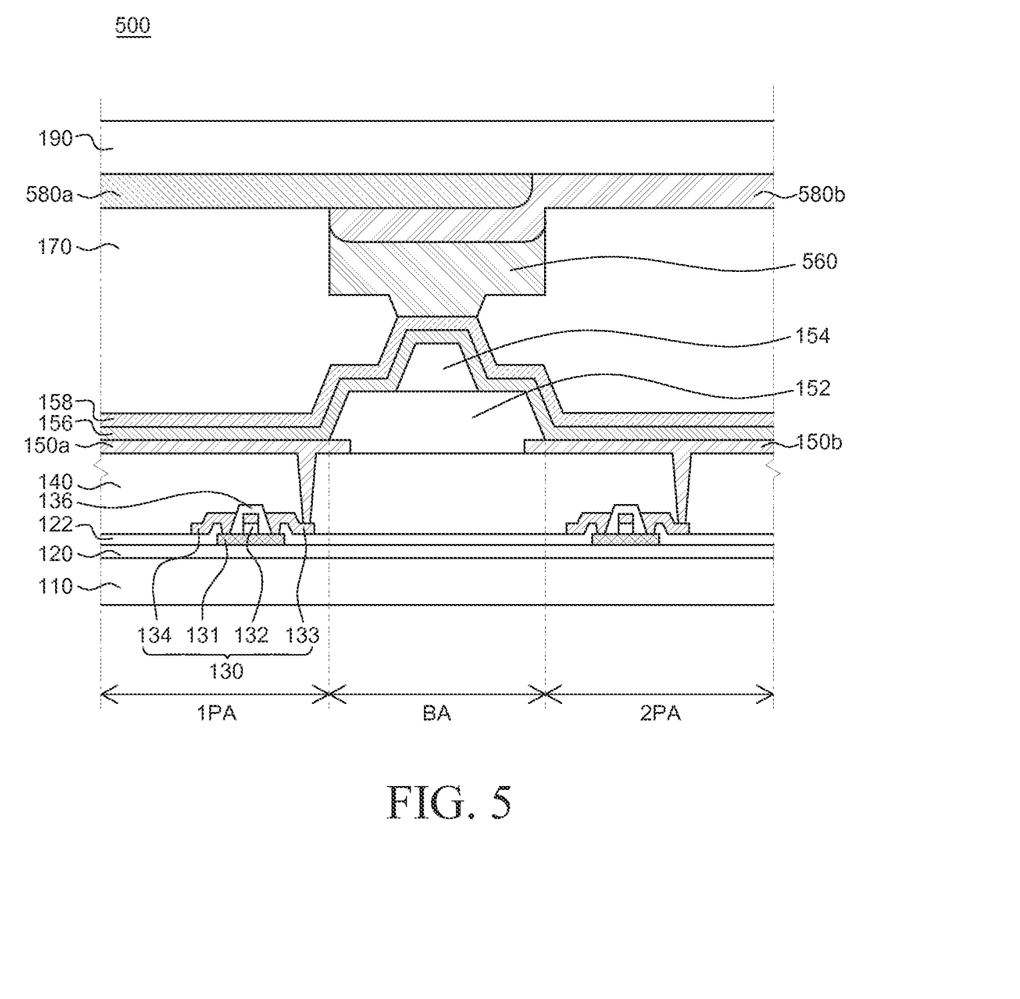
FIG. 5 is a schematic cross-sectional view of a top-emission organic light emitting display device according to still another exemplary embodiment of the present invention.

FIG. 5 is a schematic cross-sectional view of an exemplary organic light emitting display device according to an embodiment of the present invention. In this example, the first color filter layer and the second filter layer on the upper substrate 190 are arranged to overlap each other in the bank area BA and the auxiliary electrode 560 is provided thereon.

Referring to FIG. 5, both the first color filter layer 580a and the second filter layer 580b are extended to the region of the upper substrate that corresponds to the bank area BA between two adjacent sub-pixels. That is, the first color filter layer 580a and the second color filter layer 580b at least partially overlap each other in the region of the upper substrate that corresponds to the bank area BA. In this configuration, the auxiliary electrode 560 provided over the first color filter layer 580a and the second color filter layer 580b can be positioned closer to the cathode 158 on the lower substrate 110. In some embodiments, the total height of the first color filter 580a and the second color filer 580b in the region of the upper substrate 190 corresponding to the bank area BA may be about 2 μm or more.

Although both the first color filter 580a and the second color filter 580b are illustrated in FIG. 5 as being extended to the region corresponding to the bank area BA, only one of the first color filter 580a and the second color filter 580b may be provided in the region corresponding to the bank area BA to adjust the elevation of the auxiliary electrode 560. Further, the area where the first color filter 580a and the second color filter 580b need not be extended over the entire region under the auxiliary electrode 560 (or the black matrix) between the two sub-pixel areas. That is, the first color filler 580a and the second color filter 580b may be extended only partially into the region between the two sub-pixel areas. In this way, the first color filter 580a and the second color filter 580b overlap each other at the mid portion of the region between the two sub-pixel areas. The overlapping portion of the first color filter 580a and the second color filter 580b can serve as a bump, which makes the portion of the auxiliary electrode 560 over the overlapping area to be protruded toward the cathode 158 on the lower substrate 110.

As mentioned above, the auxiliary electrode 560 in the bank area BA can serve as the black matrix between the first sub-pixel area 1PA and the second sub-pixel area 2BA. Thus, the first color filter 580a and the second color filter 580b can be provided under the auxiliary electrode 560 without a separate black matrix 182 between the two sub-pixel areas as depicted in FIG. 5. However, it should be noted that the overlapping of the color filter layers in the bank area BA may be employed in various other embodiments of the organic light emitting display device of the present invention. In other embodiments, which include the discrete black matrix 182 between the two sub-pixel areas, at least one of the first color filter 580a and the second color filter 580b can be extended onto the black matrix 182. Further, a connection assistance unit 154 may also be provided between the auxiliary electrode 560 and the stack of color filters in the bank area BA.

The stack of color filters or the stack of color filter(s) and the black matrix may make it difficult for the laser to reach the auxiliary electrode 560. The throughput of the laser can be increased so that it can melt the auxiliary electrode 560 and/or to expand the connection assistance unit 154, but the increased power of the laser may damage some of the components in the organic light emitting display device 100. Accordingly, the auxiliary electrode 560 can be irradiated by the laser from the lower substrate 110 to keep the power level of the laser within the range that is suitable for other elements of the organic light emitting display device 100.

Figure 6:
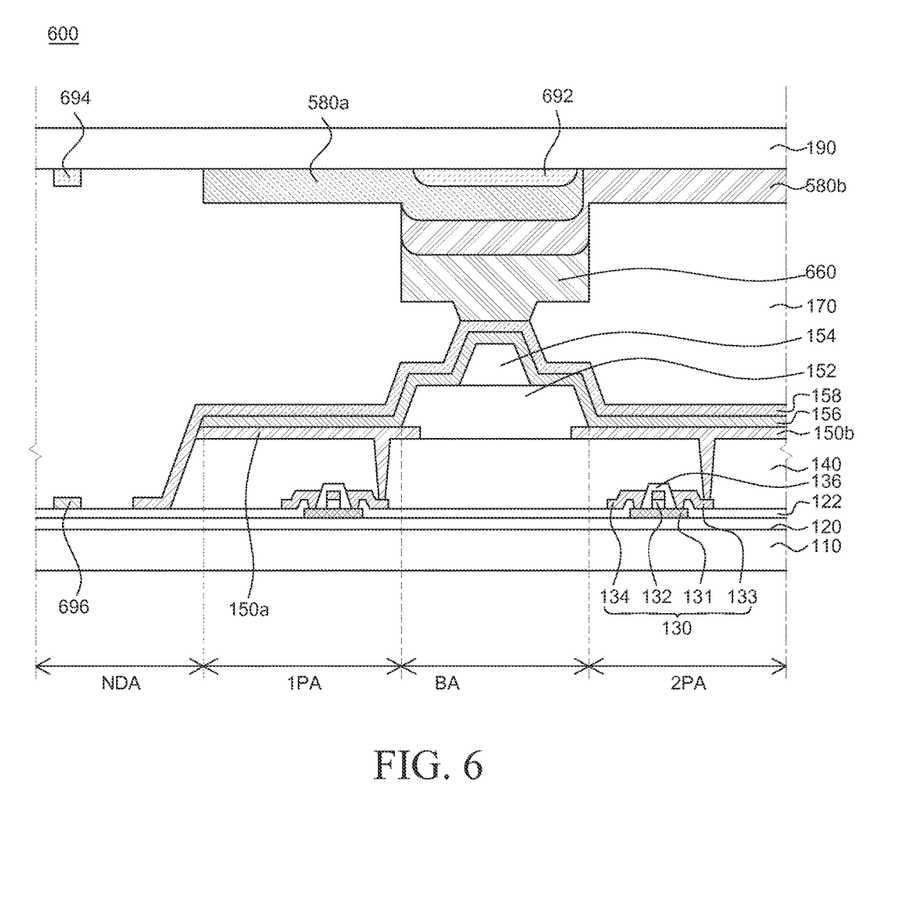
FIG. 6 is a schematic cross-sectional view of a top-emission organic light emitting display device according to still another exemplary embodiment of the present invention.

FIG. 6 is a schematic cross-sectional view of a top-emission organic light emitting display device according to still another exemplary embodiment of the present invention.

The organic light emitting display device 600 illustrated in FIG. 6 is substantially the same as the organic light emitting display device 500 illustrated in FIG. 5 except that a spacer 692, which is formed of the same material as the alignment keys 694 and 696 are provided between the auxiliary electrode 660 and the upper substrate 190. Therefore, redundant explanation thereof will be omitted.

Referring to FIG. 6, alignment keys 694 and 696 are provided on the lower substrate 110 and the upper substrate 190. The organic light emitting display device 600 further includes the spacer 692 on the upper substrate 190.

The spacer 692 is provided in the bank area BA. The spacer 692 is provided between the auxiliary electrode 660 and the upper substrate 190 to position the auxiliary electrode 660 on the upper substrate 190 closer to the cathode 158 on the lower substrate 110.

The spacer 692 and the alignment key 694 of the upper substrate 190 may be formed at the same time. That is, the spacer 692 and the alignment key 694 may be formed of the same material and by using the same process to minimize the time necessary for providing the spacer 692 in the organic light emitting display device 600. For example, the spacer 692 and the alignment key 694 may be patterned on the upper substrate 190 prior to forming the color filters and/or black matrix, and thus the spacer 692 ma be provided below the plane level of the color filters on the upper substrate 190. If the patterning of the spacer 692 and the alignment key 694 is performed after the patterning of the color filters and/or the black matrix on the upper substrate 190, the spacer 692 in the bank area BA can be interposed between the auxiliary electrode 660 and the color filters and/or black matrix.

The spacer 692 may have a height of 0.1 to 1 µm. However, it should be noted that the height of the spacer 692 is not particularly limited as such, and the height of the spacer 692 can vary depending on the height of other elements interposed between the auxiliary electrode 660 and the upper substrate 190 as well as the distance between the cathode 158 and the auxiliary electrode 660.

The spacer 692 can be formed of any material suitable for the alignment key 694 and, at the same time, that is capable of creating a bump between the auxiliary electrode 660 and the upper substrate 190. By way of example, the spacer 692 and the alignment metal 694 may be formed of a metal with low light reflectivity, but may not be limited thereto. As mentioned, the spacer 692 may interposed between auxiliary electrode 660 and the color filter and/or the black matrix in the bank area BA, and thus the spacer 692 and the alignment key 694 may also be formed of a reflective metal.

Figure 7:
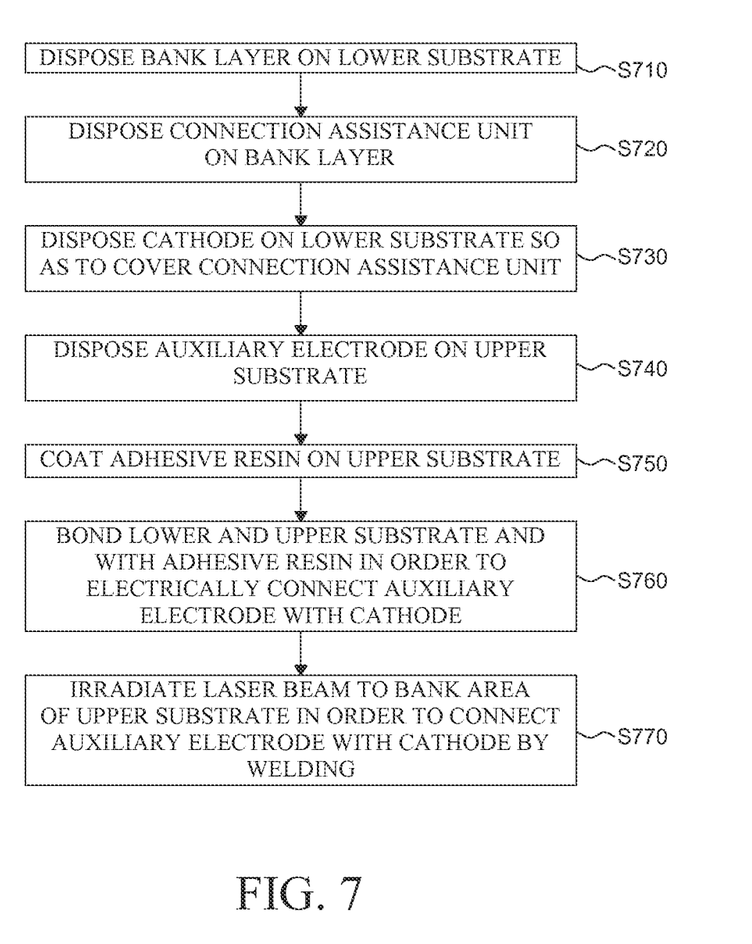
FIG. 7 is a flowchart provided to explain a method for manufacturing an organic light emitting display device according to an exemplary embodiment of the present invention.

FIG. 7 is a flowchart provided to explain a method for manufacturing an organic light emitting display device according to an exemplary embodiment of the present invention.

Firstly, a bank layer is disposed on a lower substrate to separate the first and second sub-pixel areas with the bank area BA (S710). Before the bank layer is disposed on the lower substrate, a buffer layer, a gate insulating layer, a thin film transistor, an interlayer dielectric layer, an overcoating layer, a first anode, and a second anode may be further disposed.

Then, a connection assistance unit is disposed on the bank layer (S720).

Then, a cathode is disposed on the lower substrate so as to cover the bank layer (S730). The cathode may be disposed in an entirety of the first and second sub-pixel areas, and the bank area. Before the cathode is disposed on the lower substrate, an organic light emitting layer may be further disposed.

Then, an auxiliary electrode is disposed in a bank area of an upper substrate (S740). Before the auxiliary electrode is disposed on the upper substrate, the first and second color filter layers, and a black matrix may be further disposed.

Then, an adhesive resin may be coated on the upper substrate (S750). Since the auxiliary electrode needs to be electrically connected with the cathode of the lower substrate when the lower and upper substrates are bonded to each other, a surface of the auxiliary electrode needs to avoid being coated with the adhesive resin. A predetermined process may be performed to the surface of the auxiliary electrode in order for the surface of the auxiliary electrode to have a hydrophobic property so that the surface will not be covered by the adhesive resin when the lower and upper substrates are bonded to each other with the adhesive resin. To be specific, the surface of the auxiliary electrode may be processed with plasma or may be doped with hydrophobic ions. Thus, even if the adhesive resin is coated on the entire surface of the upper substrate, the surface of the auxiliary electrode does not stick to the adhesive resin and can be exposed to the outside.

Then, the lower and upper substrates are bonded to each other with the adhesive resin in order to electrically connect the auxiliary electrode with the cathode (S760). To be specific, the adhesive resin is hardened in a state where the lower substrate is pressed to the upper substrate, so that the lower and upper substrates can be bonded to each other.

Then, a laser beam may be irradiated to the bank area of the upper substrate in order to connect the auxiliary electrode with the cathode by welding (S770). When the laser beam is irradiated, the connection assistance unit is expanded. Thus, the auxiliary electrode and the cathode can be more easily connected with each other.

Figure 8:
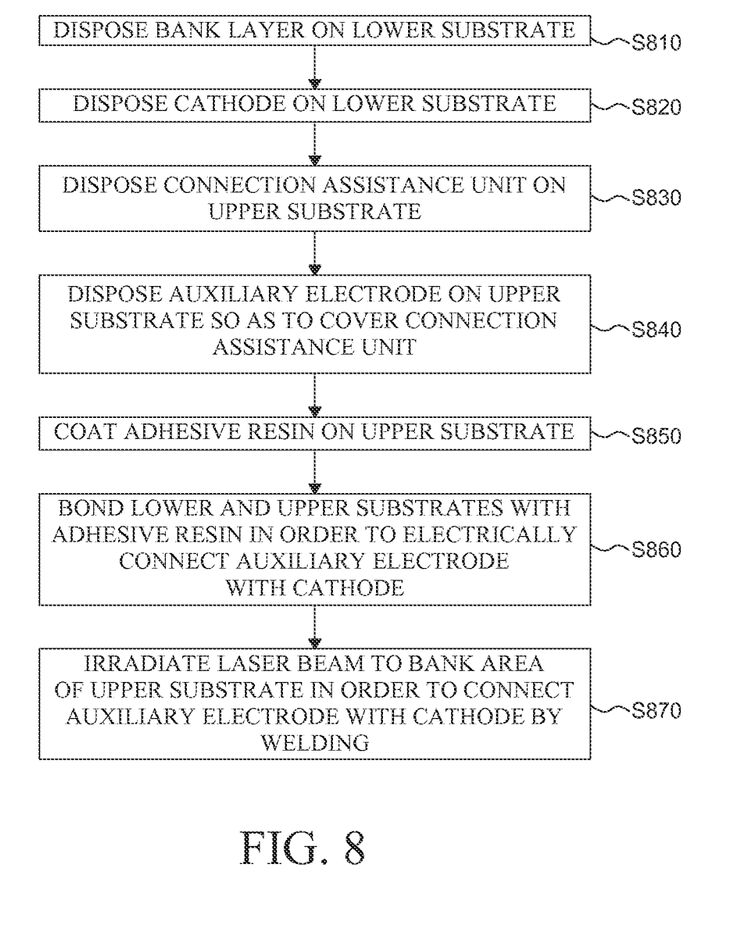
FIG. 8 is a flowchart provided to explain a method for manufacturing an organic light emitting display device according to another exemplary embodiment of the present invention.

FIG. 8 is a flowchart provided to explain a method for manufacturing an organic light emitting display device according to another exemplary embodiment of the present invention.

A method for manufacturing an organic light emitting display device illustrated in FIG. 8 is substantially the same as the method for manufacturing an organic light emitting display device illustrated in FIG. 7 except the connection assistance unit is disposed on the upper substrate. Therefore, redundant explanation thereof will be omitted.

Firstly, the bank layer is disposed on the lower substrate (S810), and the cathode is disposed so as to cover the bank layer (S820).

Then, the connection assistance unit is disposed on the upper substrate (S830), and the auxiliary electrode is disposed so as to cover the connection assistance unit (S840).

Then, the adhesive resin is coated on the upper substrate (S850), and the lower and upper substrates are bonded to each other with the adhesive resin in order to electrically connect the auxiliary electrode with the cathode (S860).

Then, a laser beam is irradiated to the bank area of the upper substrate in order to connect the auxiliary electrode with the cathode by welding (S870).

Figure 9:
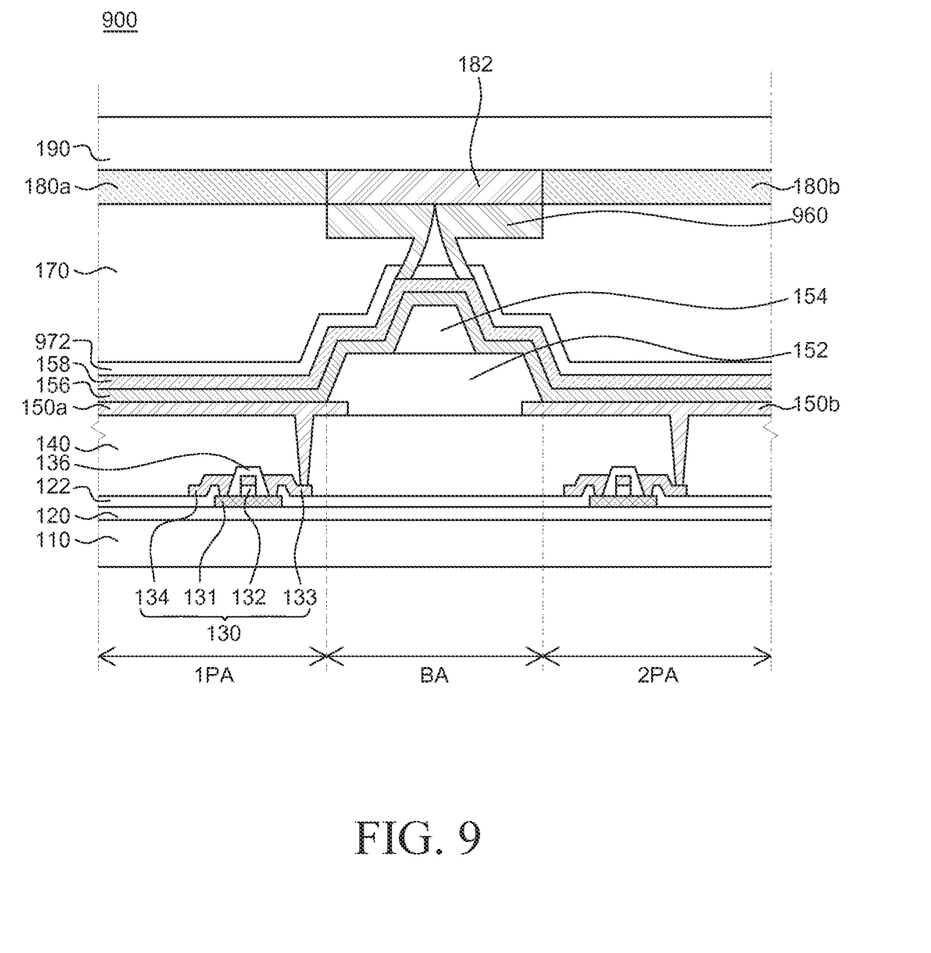
FIG. 9 is a schematic cross-sectional view of a top-emission organic light emitting display device according to still another exemplary embodiment of the present invention.

FIG. 9 is a schematic cross-sectional view of a top-emission organic light emitting display device according to still another exemplary embodiment of the present invention.

An organic light emitting display device 900 illustrated in FIG. 9 is substantially the same as the organic light emitting display device 100 illustrated in FIG. 1 except a protective layer 972 is further included and an auxiliary electrode 960 is connected with the cathode 158 with the protective layer 972 interposed therebetween. Therefore, redundant explanation thereof will be omitted.

Referring to FIG. 9, the organic light emitting display device 900 further includes the protective layer 972. The protective layer 972 is disposed between the cathode 158 and the adhesive resin layer 170. The protective layer 972, has a barrier property and suppresses penetration of moisture or oxygen into the organic light emitting layer 156. The protective layer 972 may be formed of a material selected from the group consisting of materials having an excellent barrier property and transparency, such as aluminum oxide (AlOx), aluminum oxide nitride (AlOxNy), titanium oxide (TiOx), silicon oxide (SiOx), zinc oxide (ZnOx), and zirconium oxide (ZrOx). The protective layer 972 may be disposed on the lower substrate 110 before the lower substrate 110 and the upper substrate 190 are bonded to each other.

Referring to FIG. 9, the auxiliary electrode 960 is electrically connected with the cathode 158 with the protective layer 972 interposed therebetween. As illustrated in FIG. 9, the auxiliary electrode 960 may have a shape in which a distance between two parts of the auxiliary electrode 960 gradually increases from the upper substrate 190 toward the lower substrate 110. The shape of the auxiliary electrode 960 is formed when a laser beam is irradiated toward the bank area BA of the upper substrate 190. To be specific, by the laser beam, a part of the cathode 158 and a part of the auxiliary electrode 960 are melted and the protective layer 972 is decomposed, so that the part of the cathode 158 and the part of the auxiliary electrode 960 are connected with each other by welding.

The organic light emitting display device 900 according to still another exemplary embodiment of the present invention includes the protective layer 972 interposed between the cathode 158 and the auxiliary electrode 960 and also has a structure in which the cathode 158 and the auxiliary electrode 960 are connected with each other by welding by laser irradiation. Thus, the organic light emitting display device 900 has an improved uniformity in luminance and also an improved product life due to the protective layer 972 that protects the organic light emitting display device 900 from moisture or oxygen.

Although the exemplary embodiments of the present invention have been described in detail with reference to the accompanying drawings, the present invention is not limited thereto and may be embodied in many different forms without departing from the technical concept of the present invention. Therefore, the exemplary embodiments of the present invention are provided for illustrative purposes only but not intended to limit the technical concept of the present invention. The scope of the technical concept of the present invention is not limited thereto. Therefore, it should be understood that the above-described exemplary embodiments are illustrative in all aspects and do not limit the present invention. The protective scope of the present invention should be construed based on the following claims, and all the technical concepts in the equivalent scope thereof should be construed as falling within the scope of the present invention.

What is claimed is:

1. An organic light emitting display device comprising:
a lower substrate and an upper substrate;
a bank layer on the lower substrate to define a plurality of sub-pixel areas;
a cathode provided on the lower substrate, the cathode covering the plurality of sub-pixel areas and the bank layer;
an auxiliary electrode provided on the upper substrate, the entire auxiliary electrode being positioned between two immediately adjacent sub-pixel areas among the plurality of pixel areas defined by the bank layer;
a connection assistance unit provided on at least one of the lower substrate and the upper substrate, wherein the connection assistance unit is positioned to make the auxiliary electrode on the upper substrate be in contact with the cathode on the lower substrate,
wherein the auxiliary electrode has a hydrophobic property.

2. The organic light emitting display device according to claim 1, wherein the connection assistance unit is interposed between the bank layer and the cathode such that a portion of the cathode on the bank layer is protruded toward the auxiliary electrode on the upper substrate.

3. The organic light emitting display device according to claim 2, further comprising:
an additional connection assistance unit interposed between the auxiliary electrode and the upper substrate such that the auxiliary electrode over the connection assistance unit is protruded toward a portion of the cathode on the bank layer.

4. The organic light emitting display device according to claim 3, wherein the additional connection assistance is formed of a material that expands upon laser irradiation.

5. The organic light emitting display device according to claim 2, further comprising:
a first color filter and a second color filter on the upper substrate, each of the first color filter and the second color filter corresponding to a different sub-pixel area of the two immediately adjacent sub-pixel areas separated by the auxiliary electrode, wherein at least one of the first color filter and the second color filter is arranged to overlap with the auxiliary electrode.

6. The organic light emitting display device according to claim 2, further comprising:
an alignment key disposed in a non-display area of the upper substrate for alignment between the upper and lower substrates; and
a spacer on the upper substrate provided under the auxiliary electrode,
wherein the spacer and the alignment key are formed of a same material.

7. The organic light emitting display device according to claim 1, wherein the connection assistance unit is interposed between the auxiliary electrode and the upper substrate such that the auxiliary electrode over the connection assistance unit is protruded toward a portion of the cathode on the bank layer.

8. The organic light emitting display device according to claim 1, wherein the auxiliary electrode is configured to prevent mixing of colors between a first sub-pixel area and a second sub-pixel area.

9. The organic light emitting display device according to claim 1, further comprising a first color filter and a second color filter on the upper substrate, each of the first color filter and the second color filter corresponds to a different sub-pixel area of the two immediately adjacent sub-pixel areas separated by the auxiliary electrode.

10. The organic light emitting display device according to claim 9, wherein at least one of the first color filter and the second color filter is arranged to overlap with the auxiliary electrode.

11. The organic light emitting display device according to claim 10, wherein a portion of the first color filter and a portion of the second color filter both overlap with the connection assistance unit and the auxiliary electrode.

12. The organic light emitting display device according to claim 1, further comprising a black matrix overlapping with the auxiliary electrode and the connection assistance unit.

13. The organic light emitting display device according to claim 1, wherein a width of a contact surface between the cathode and the auxiliary electrode is at least 50 μm.

14. The organic light emitting display device according to claim 1, wherein the auxiliary electrode is formed of a low-reflectivity metal having a light reflectivity of 20 to 40%.

15. The organic light emitting display device according to claim 1, further comprising a protective layer disposed on the cathode.

16. A method for manufacturing an organic light emitting display device, the method comprising:
- providing a bank layer on a lower substrate to define a plurality of sub-pixel areas;
- providing a cathode on the lower substrate, the cathode covering the plurality of sub-pixel areas and the bank layer;
- providing an auxiliary electrode provided on an upper substrate, the entire auxiliary electrode being positioned between two immediately adjacent sub-pixel areas among the plurality of pixel areas defined by the bank layer; and
- providing a connection assistance unit on at least one of the lower substrate and the upper substrate, wherein the connection assistance unit is positioned to make the auxiliary electrode on the upper substrate be in contact with the cathode on the lower substrate,
- wherein the auxiliary electrode has a hydrophobic property.

17. The method according to claim 16, wherein the step of providing the connection assistance unit results in the connection assistance unit being interposed between the bank layer and the cathode such that a portion of the cathode on the bank layer is protruded toward the auxiliary electrode on the upper substrate.

18. The method according to claim 17, further comprising:
- providing an additional connection assistance unit interposed between the auxiliary electrode and the upper substrate such that the auxiliary electrode over the connection assistance unit is protruded toward a portion of the cathode on the bank layer.

19. The method according to claim 18, further comprising:
- providing a first color filter and a second color filter on the upper substrate, each of the first color filter and the second color filter corresponding to a different sub-pixel area of the two immediately adjacent sub-pixel areas separated by the auxiliary electrode, wherein at least one of the first color filter and the second color filter is arranged to overlap with the auxiliary electrode.

20. The method according to claim 19, wherein a surface of the auxiliary electrode is processed with plasma or is doped with hydrophobic ions.

* * * * *